United States Patent
Maltseff et al.

(10) Patent No.: US 7,180,640 B2
(45) Date of Patent: Feb. 20, 2007

(54) MONOLITHIC MICRO SCANNING DEVICE

(76) Inventors: Paul A. Maltseff, 5106 149th Pl. SW., Edmonds, WA (US) 98026; Ronald D. Payne, 20232 76th Avenue W., Snohomish, WA (US) 98296; Jean-Louis Massieu, Buroparc 2, voie 2, Rue de la decouverte BP 187 (FR) 31676

( * ) Notice: Subject to any disclaimer, the term of this patent is extended or adjusted under 35 U.S.C. 154(b) by 868 days.

(21) Appl. No.: 10/251,367

(22) Filed: Sep. 20, 2002

(65) Prior Publication Data

US 2004/0057085 A1    Mar. 25, 2004

(51) Int. Cl.
*H04N 1/04*    (2006.01)
(52) U.S. Cl. ............ 358/474; 358/486; 358/513; 358/475; 358/509; 250/208.1; 250/236
(58) Field of Classification Search ............ 358/474, 358/486, 513, 512, 1.1, 514, 505, 475; 250/208.1, 250/236
See application file for complete search history.

(56) References Cited

U.S. PATENT DOCUMENTS

| 4,445,125 | A | * | 4/1984 | Scifres et al. ............ 347/237 |
| 4,462,658 | A |  | 7/1984 | Scifres |
| 5,625,483 | A |  | 4/1997 | Swartz |
| 5,966,230 | A | * | 10/1999 | Swartz et al. ............ 359/196 |
| 6,252,220 | B1 | * | 6/2001 | Jedlicka et al. .......... 250/208.1 |
| 6,305,607 | B1 |  | 10/2001 | Katz |
| 6,334,573 | B1 | * | 1/2002 | Li et al. ............ 235/462.32 |
| 6,768,565 | B1 | * | 7/2004 | Perregaux et al. .......... 358/505 |

* cited by examiner

*Primary Examiner*—Douglas Q. Tran
*Assistant Examiner*—Negussie Worku

(57) ABSTRACT

A monolithic micro scanning device comprising multiple substrates; source of light for generating a light beam disposed on one of said substrates; and micro mirror disposed on one of said substrates for repetitively and cyclically moving light beam to scan insignia impregnated on a surface of different articles is described. More particularly, the scanning device comprises a combination of stacked dies in suitable form factor to optimize a system configuration and packaging.

11 Claims, 6 Drawing Sheets

Simplified schematic drawing of monolithic scanning engine

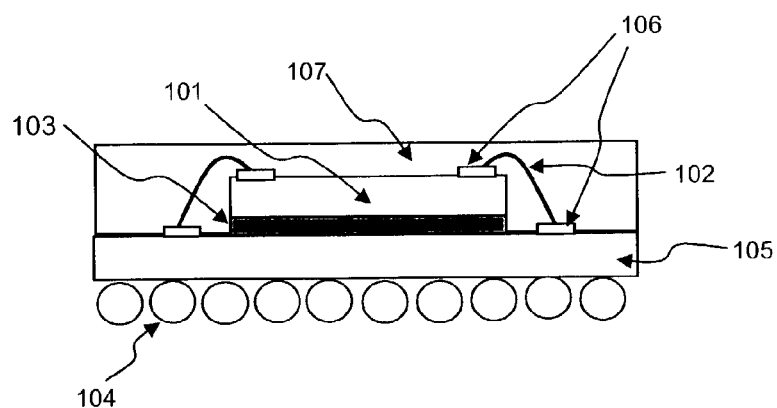
Figure 1. Schematic drawing of a die-up BGA construction
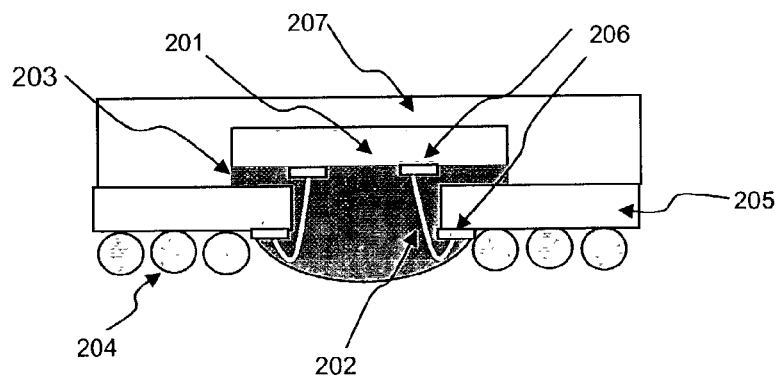
Figure 2. Schematic drawing of a die down center bond substrate BGA construction

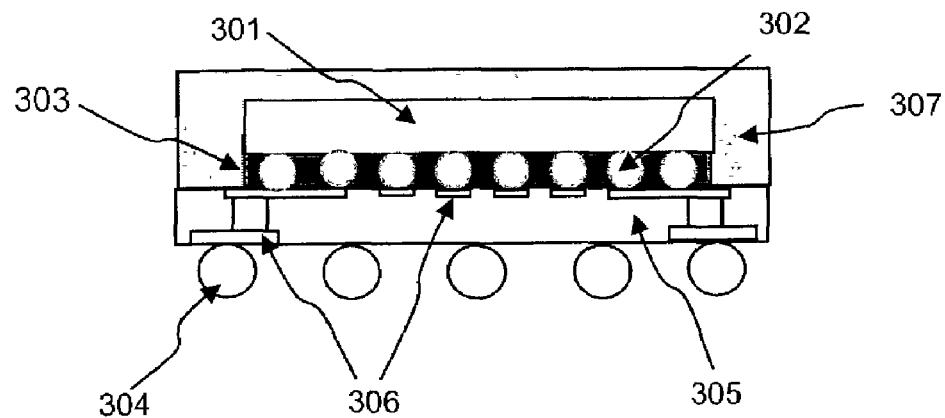
Figure 3. Die down bumped die substrate BGA construction
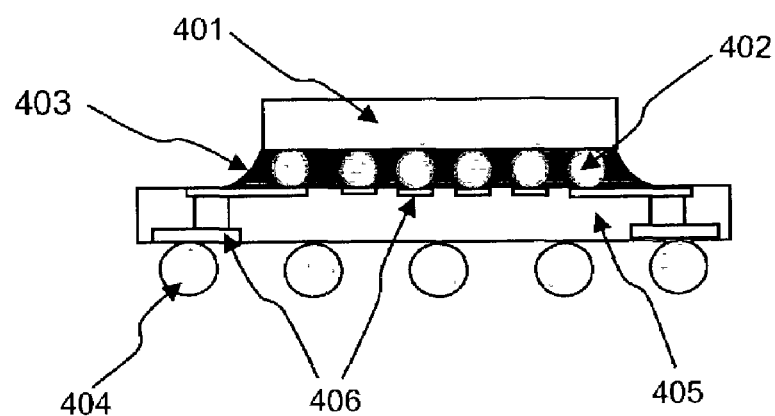
Figure 4. Schematic drawing of a flip chip package

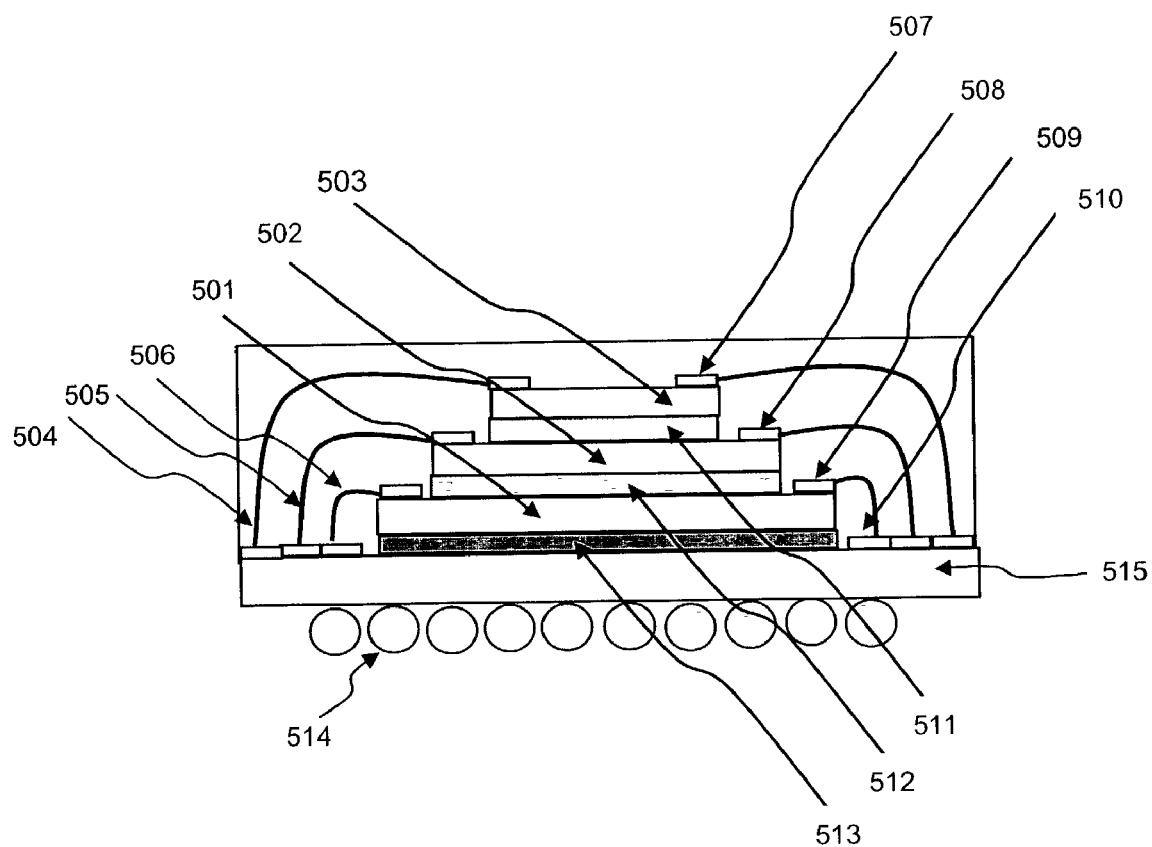
Figure 5. Schematic drawing of a pyramid stack package

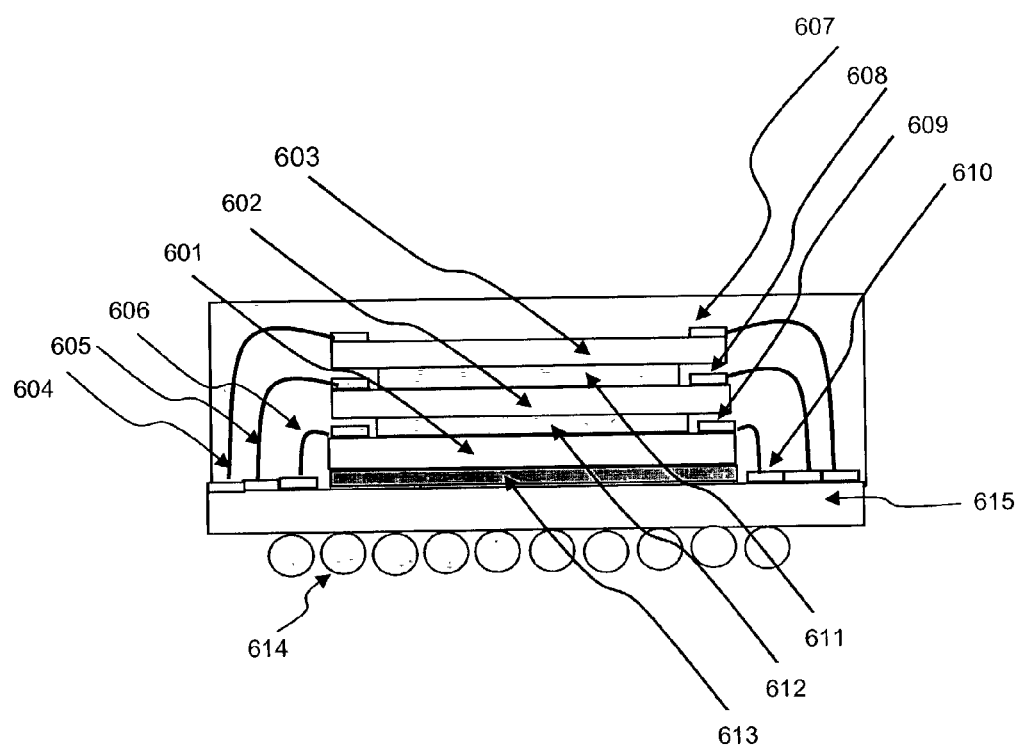
Figure 6. Schematic drawing of stacked package with multiple die of the same size

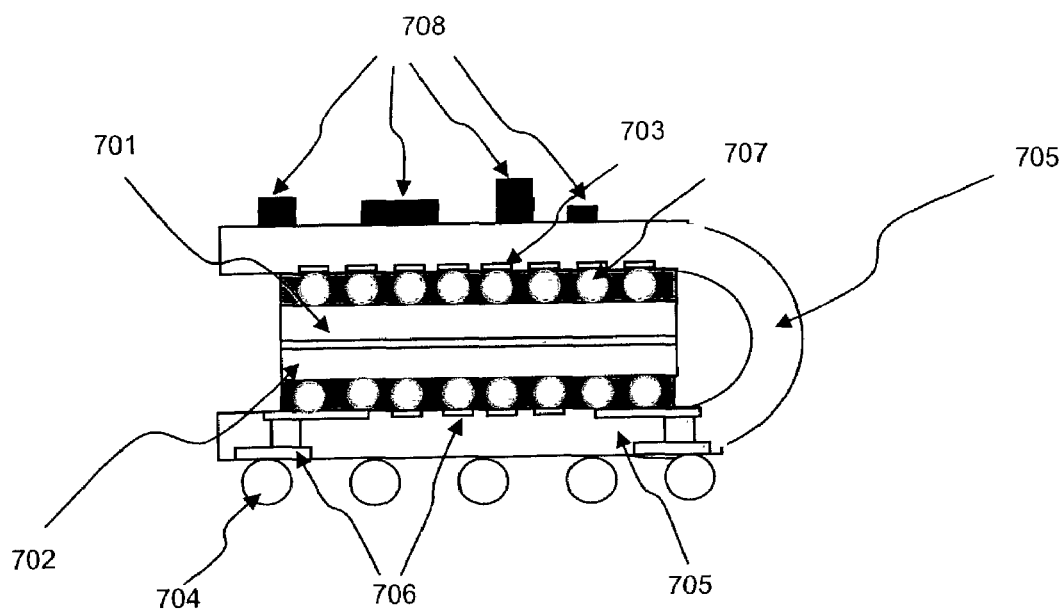
Figure 7. Schematic drawing of folded-flex stacked package with two die

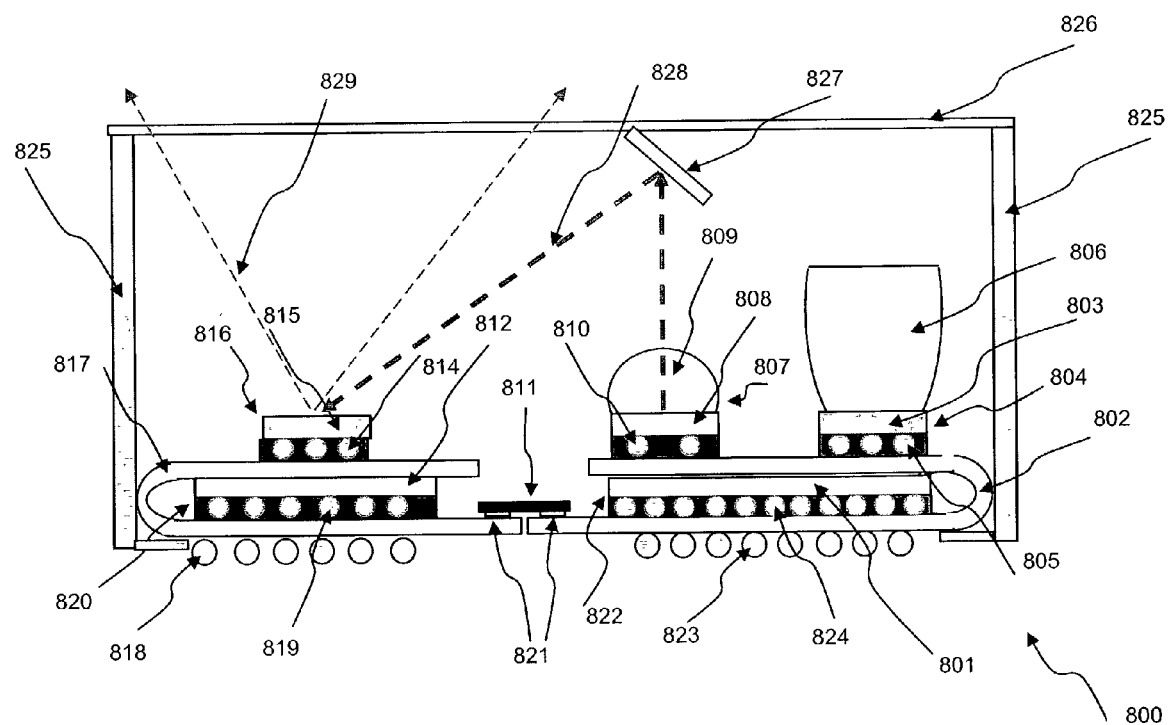
Figure 8. Simplified schematic drawing of monolithic scanning engine

MONOLITHIC MICRO SCANNING DEVICE

BACKGROUND OF THE INVENTION

1. Field of the Invention

The present invention generally relates to integrated scanning systems for reading multiple insignia impregnated on a surface of different articles and, more particularly, to scanning system based on nano-components and integrated in one monolithic device.

2. Description of Related Art

A general concept of a scanning device has been discussed in a number of U.S. patents and publications. Multiple scanning devices currently are available on a market for reading various insignia impregnated on a surface. On the other hand, the progress in the nanotechnology and particular in the manufacturing of resonantly excited scanning mirrors, light emitting and receiving components, and micro optics have reached a point when it have become apparent that new concepts for the design of compact monolithic micro scanners should be applied.

The challenge of designing of integrated scanning devices had evolved over the years as the scale and extend of functions assigned to devices has increased. The integration requirements have evolved in much the same way. As the scale and extend increased, the single function system became less practical. Multifunctional system design presented a new set of problems related to physical, electrical, logical, and etc. system interactions. Collaboration between different components/modules/subsystems carrying out application tasks usually requires a sharing of signals and/or data. Designers typically are solving these collaboration problems by employing specific proprietary schemes.

For a long time the focus in the system design was on a chip level, making chips smaller, faster, more powerful and more efficient while simultaneously reducing cost and improving reliability. The manufacturers simply designed the integrated circuits and packaged them. There have been several fundamental shifts in the history of electronic packaging that profoundly affected an electronic industry, such as Surface mount technology (SMT)

Area array packages, like ball grid array (BGA)

Chip scale packaging

Wafer level packaging (WLP)

From a functional point of view, a package is a link between the small dimensions of the integrated circuits and the larger dimensions of the printed circuit boards. It is quite obvious that methods developed for integrated microelectronic assembly could be applied for integrating and packaging more complex monolithic systems with multiple physical components. A monolithic micro scanner is expected to have several advantages compared with conventional scanners: smaller physical footprint, less power consumption, and longer lifetime.

A crucial objective of nanotechnology is to make products inexpensively. Inherently nanotechnology is suitable for low-cost production and high flexibility in production, which is vital for maintaining continuous competitive capability for any technology.

The design of smaller, lighter, and thinner scanning system is only possible by further miniaturization of system's components and implementation of the conceptually new design architecture. System on a package (SOP) paradigm provides such desired capabilities.

SOP offers significant savings in space and costs, as well as provides an optimum distribution of functions between or within system's components. There are several advantages of SOPs compare to other integrating technologies:

SOPs can carry diverse components form factors such as flip chips, SMT discretes, etc.

It is based on techniques and know-how developed for maximum utilization of the surface area of the package; it also relaxing the application board design requirements.

Low package failure rates can be achieved through the use of different techniques and proven board attachment technologies.

Electrical characteristics and efficiency are enhanced through shorter interconnections of die on an SOP.

SOP is shortening a design time. Use of SOP can eliminate the need to design a single, large, complex chip to contain diverse functions. Smaller, functional chips can be tightly integrated into an SOP, often with no sacrifice in layout complexity vs. a single chip solution.

The integration of MEMS scanning systems fundamentally has close association with particular applications. There is a significant difference between the rationales for packaging integrated circuits (IC) and packaging MEMS based scanning devices. The purpose of IC packaging is to provide physical support for the chip, to provide an electrical interface to active chips in the system, to supply signal, power and ground interconnections, allow heat dissipation, and to isolate the chip physically from its environment. MEMS devices, on the other hand, are intended to interface directly with their environment. Consequently, they need an application specific packaging scheme and a corresponding functional interface. MEMS's package is a part of a complete system and all components of the system must function together and be compatible with each other.

Numerous approaches for designing integrated scanning systems are known in the prior art. However, their main focus was on the integration of a scanning device on a common substrate. It is a purpose of the present invention to provide a monolithic scanning device, which can be composed from multiple components with different form factors, utilizes with high efficiency available package space to provide "more functionality in a smaller space", and has a superior performance.

SUMMARY OF INVENTION

Briefly, and in general terms, the present invention provides a monolithic micro scanning device including multiple substrates; source of light for generating a light beam disposed on one of said substrates; and micro mirror disposed on one of said substrates for repetitively and cyclically moving light beam to scan insignia impregnated on a surface of different articles. More particularly, the scanning device comprises a combination of stacked dies in suitable form factor to optimize a system configuration.

The novel features which are considered as characteristics for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWINGS

FIG. 1 is showing a simplified schematic drawing of a die-up BGA construction.

FIG. 2 is showing a simplified schematic drawing of a die down center bond substrate BGA construction.

FIG. 3 is showing a simplified schematic drawing of die down bumped die substrate BGA construction.

FIG. 4 is showing a simplified schematic drawing of a flip chip package.

FIG. 5 is showing a simplified schematic drawing of a pyramid stack package.

FIG. 6 is showing a simplified schematic drawing of stacked package with multiple die of the same size.

FIG. 7 is showing a simplified schematic drawing of folded-flex stacked package with two die.

FIG. 8 is showing a simplified schematic drawing of monolithic scanning engine.

DETAILED DESCRIPTION

The present invention is directed to a scanning system based on nano-components and integrated in one monolithic device. While the present invention is described herein with reference to illustrative embodiments for particular applications, it should be understood that the invention is not limited thereto. Those having ordinary skill in the art and access to the teachings provided herein will recognize additional modifications, applications and embodiments within the scope thereof and additional fields in which the present invention would be of significant utility.

In the beginning we will describe some packaging constructions, which will be employed in the present invention.

FIG. 1, shows a schematic view of the basic configurations of the Ball Grid Array (BGA) package. It is constructed of a substrate 105, for example made of plastic, silicon oxide, silicon glass, or other low k-dielectric material onto which a die 101 in mounted and an array of balls 104 is attached. The die 101 is attached to the substrate 105 by a die attached material 103, such, for example, as Ablebond 8380 Electrically Conductive Die Attach Adhesive manufactured by Ablestik Electronic Materials and Adhesives of California. The die 101 is encapsulated by overmold compound 107 for protection. All configurations of BGA package maintain the same ball interface, although they use different die connection methods. In the die-up substrate configuration, see FIG. 1, the die 101 is connected to the substrate 105 by wire bonds 102. In the die down center bond substrate configuration, see FIG. 2, the die 201 is connected to the substrate 205 by wire bonds 202. In the die down bumped die substrate configuration, see FIG. 3, the die 301 is connected to the substrate 305 by fine-pitch ball array 302. The last configuration sometimes identified as a chip scale package (CSP), since overall package size of a CSP is typically no larger that 1.2 times of the silicon die.

FIG. 4 shows a schematic drawing of a flip chip package. It is quite easy to see that flip chip package is sharing the same basic architecture as a die down bumped die substrate configuration. The flip chip package comprises first die 401, second die 405, die underfill 403, solder bumps 402, solder balls 404, and conductive pads 406. From a manufacturing point of view, flip chip assembly is the process of connecting face down (flipped) components directly with the board or substrate through conductive bumps on the chip bond pads. In other words, the semiconductor devices are mounted and electrically connected face-down directly onto substrates to the next level of interconnect. The contacts are made directly between the device and the electronic product, rather than through the wires used in wire bonding. This results in significant signal inductance reduction, because the interconnects are much shorter, compared to wire bonding. Since flip chip connections can use the whole area of the die, flip chip can accommodate many connections on a smaller die and the I/O density off the chip can be dramatically increased compare to wire bonding connections. The most important advantages of flip chip package are as follows:

Superior electrical performance with reduced inductance and capacitance of the connections and shortened signal paths;

Low electromagnetic emissions;

Flexibility in layout and the potential for a high number of connections per chip area;

Better heat transfer characteristics with a heat sink directly attached to the die;

High potential for cost reduction;

The most rugged interconnection method; flip chips, when completed with an adhesive "underfill," are practically solid little blocks of cured epoxy.

The integration of multiple silicon dies into a stacked package is providing reduced space, weight saving and enhanced electrical performance. The stacking principle is usually applied to bare die. There are several techniques for stacking. One of the simplest techniques is to bond a smaller die on top of a larger one, leaving enough clearance for wire bonding. The pyramid wire bonded stack is shown in FIG. 5, where the die 501 is supporting the die 502, which in its turn is supporting the die 503. The bonding wires 504, 505, and 506 are connected to conductive pads 507, 508, 509 and 510. First die is wire bonded and then the next die is attached on top of the first followed by wire bonding. The process is repeated until the desired stack is obtained. The stack package also includes die attach layers 511 and 512, die underfill layer 513, and plastic substrate 515, onto which the die 501 is mounted and an array of balls 514 is attached. Flexible circuitry can be used to connect multiple levels. Flex is a best option where the volume of the device must be minimized.

The stacked die can all be the same size as it is shown on FIG. 6. The significant difference in this design is that die attach layers 611 and 612 do not support all die's suffices 602 and 603.

The folded flex stacked die package, see FIG. 7, is offering a new level of flexibility for the design of micro system. The flexible substrate 705 is folded so to stack at least some of the microelectronic elements (in present example die 701 and 702) in substantially vertical alignment with one another to provide a stacked assembly with the conductive terminals (solder balls 704 or lands) exposed at the bottom end of the stack. Die 701 and 702 are connected to flexible substrate 705 by fine-pitch ball array 707. Die also can be connected to substrate by a bumpless-buildup-layer. Passive components 707 may be added in the same package to increase its functionality.

The major reasons for implementation of stacked die applications, as it was already mentioned, are reduced space, weight saving and enhanced electrical performance of the portable devices. Stacking of chips, in which two or more ICs of different types are placed at the same coordinates in the x-y plane, is an alternative to silicon integration. Stacked die applications provide flexibility in combining different devices without touching the design level of silicon. The functionality of the device can be doubled or tripled in the same package size. The vertically integrated system in a package has a much higher package integration ratio compared to the single die solution. In addition, the electrical performance and reliability of stacked die is improved because only one package has to be tested.

The variations of stacked-die package options define a special type of packaging creating which is commonly called as 3-D packages. Depending on the level of functional integration, 3-D packages may also be classified as systems-in-packages (SIP).

FIG. 8 shows a simplified schematic drawing of monolithic scanning engine 800. The flexible substrate 802 is folded to accommodate the following components:

a light receiving element 804, such as photodiode, CCD or SMOS imaging component, comprising die 803, an optical component 806, and connecting elements 805;

a light emitting element 807, such as laser diode, LED, or VCSEL, comprising die 808, an optical component 809, and connecting elements 810;and a control and/or processing circuitry 822 comprising die 801 and connecting elements 824.

The die of light receiving 804 and emitting elements 807 may be connected to the substrate 802 by fine-pitch ball arrays, bumpless buildup layer, or contacts developed by NanoPierce Technologies Inc. and which consist of embedding small hard particles on a contact pad and plating over it with nickel. These hard, conductive protrusions are then used to make a contact between pads on a chip and pads on a substrate. There is no wafer bumping or wire bonding kind of process to create the connection.

In another possible embodiment the light receiving and emitting element may be deposed directly on the substrate.

A control and/or processing circuitry 822 is responsible for the control and/or processing signals from/to light emitting and light receiving elements 804 and 807.

The flexible substrate 817 is accommodating a light deflecting element 816 which is comprised of oscillating micro-mirror 815 and connecting elements 814. The micro-mirror may be such as an electro-statically excited one or two dimensional mirror similar to the micro-mirror developed in Fraunhofer Institute of Microelectronic, Dresden, Germany or thermally actuated micro-mirror developed in Ecole Politechnique Federal de Lausanne, Lausanne, Switzerland.

A control circuitry 820 is responsible for generating all signals necessary for excitement and oscillation of micro-mirror. It should be pointed out that control circuitry 820 may be integrated with a control and/or processing circuitry 822 on one die.

The substrates 802 and 817 may be connected by a connector 811 which operationally connects control circuitries 820 and 822 through contact pads 821. Connector 811 can also serve as a structural element supporting the mechanical integrity of the device.

To direct a beam a light 828 emitting by the light emitting element 897 to the light deflecting element 820, an additional mirror 827 is employed. The deflected beam of light 829 is directed through window 826.

It will be apparent to those skilled in the art that various modifications and variations can be made in the monolithic scanner by employing multiple packaging schemes without departing from the spirit or scope of the present invention.

What is claimed is:

1. A monolithic micro scanning device, comprising:
   a first substrate;
   a light emitting element mounted on the first substrate for producing a beam of light directed to an insignia;
   a light receiving element mounted on the first substrate for detecting a reflected light from the insignia;
   a processing circuitry mounted on the first substrate for processing signals from/to light emitting and receiving elements;
   a second substrate;
   a light deflecting element mounted on the second substrate for deflecting light produced by said light emitting element,
   wherein said first substrate and said second substrate are operationally connected with each other.

2. A monolithic micro scanning device of claim 1, further comprising a static mirror to direct the light beam from the light emitting element to the light deflecting element.

3. A monolithic micro scanning device of claim 1, wherein said first substrate and said second substrate further comprising contacts to operationally communicate with each other.

4. A monolithic micro scanning device of claim 1, wherein the light emitting element further comprising optical lens mounted on the light emitting element.

5. A monolithic micro scanning device of claim 1, wherein at least the first substrate or the second substrate is a flexible substrate.

6. A monolithic micro scanning device of claim 1, wherein at least the light emitting element, the light receiving element, or the processing circuitry is attached in a flip chip configuration.

7. A monolithic micro scanning device of claim 1, wherein the light receiving element comprising an array of more than one independent sensing element, each said sensing element having an output providing a signal representative of the reflected light.

8. A monolithic micro scanning device, comprising:
   a first substrate;
   a light emitting element deposed on the first substrate for producing a beam of light directed to an insignia;
   a light receiving element deposed on the first substrate for detecting a reflected light from said insignia;
   a second substrate;
   a light deflecting element deposed on the second substrate for deflecting a static mirror to direct the light beam from the light emitting element to light deflector element, light produced by said light emitting element, wherein said first substrate and said second substrate are operationally connected with each other.

9. A monolithic micro scanning device of claim 8, wherein said first substrate and said second substrate further comprising deposed contacts to operationally communicate with each other.

10. A monolithic micro scanning device of claim 8, wherein said first substrate further comprising optical lens mounted on the light emitting and light receiving elements.

11. A monolithic micro scanning device of claim 8, wherein the deposed light receiving element comprising an array of more than one independent sensing element, each said sensing element having an output providing a signal representative of the reflected light.

* * * * *